United States Patent
Nagasaka

(10) Patent No.: US 7,420,754 B2
(45) Date of Patent: Sep. 2, 2008

(54) OPTICAL MODULE AND METHOD FOR MANUFACTURING THE SAME

(75) Inventor: Kimio Nagasaka, Hokuto (JP)

(73) Assignee: Seiko Epson Corporation (JP)

( * ) Notice: Subject to any disclaimer, the term of this patent is extended or adjusted under 35 U.S.C. 154(b) by 8 days.

(21) Appl. No.: 11/626,900

(22) Filed: Jan. 25, 2007

(65) Prior Publication Data
US 2007/0177266 A1 Aug. 2, 2007

(30) Foreign Application Priority Data
Feb. 1, 2006 (JP) ............................. 2006-024558

(51) Int. Cl.
G02B 7/02 (2006.01)
G02B 6/36 (2006.01)
H01L 23/02 (2006.01)

(52) U.S. Cl. .................... 359/811; 359/819; 385/88; 385/94; 257/433; 257/434; 257/99; 257/680; 250/239

(58) Field of Classification Search ............... 359/811, 359/819, 710–712, 708, 731, 852, 859; 257/99, 257/432–434, 777, 778, 723, 704, 730, 731, 257/783, 784, 678, 684, 686; 362/310, 311, 362/339, 268, 293, 327, 84, 347, 494, 800; 250/216, 239, 338.1, 338.3, 504 R; 313/110, 313/113, 502, 512; 385/88, 92, 94, 146; 348/294, 340; 174/521

See application file for complete search history.

(56) References Cited

U.S. PATENT DOCUMENTS

| | | | | |
|---|---|---|---|---|
| 4,896,217 A * | 1/1990 | Miyazawa et al. | ........... | 348/340 |
| 6,663,296 B1 * | 12/2003 | Blair et al. | ..................... | 385/92 |
| 6,758,611 B1 * | 7/2004 | Levin et al. | ................... | 385/93 |
| 6,791,076 B2 * | 9/2004 | Webster | ..................... | 250/239 |
| 6,953,291 B2 * | 10/2005 | Liu | ............................. | 385/94 |
| 7,226,222 B2 * | 6/2007 | Nagano et al. | ................ | 385/94 |
| 7,296,939 B2 * | 11/2007 | Sonoda et al. | ................ | 385/94 |
| 2006/0102917 A1 * | 5/2006 | Oyama et al. | ................. | 257/99 |
| 2007/0047109 A1 * | 3/2007 | Shibata et al. | ............. | 359/819 |
| 2007/0158773 A1 * | 7/2007 | Cheng | ........................ | 257/433 |
| 2007/0189676 A1 * | 8/2007 | Nagasaka | .................... | 385/92 |

FOREIGN PATENT DOCUMENTS

JP 2002-534813 10/2002
WO WO 00/41281 7/2000

* cited by examiner

Primary Examiner—Loha Ben
(74) Attorney, Agent, or Firm—Harness, Dickey & Pierce, P.L.C.

(57) ABSTRACT

An optical module includes: an optical element; a support member for supporting the optical element; a lid member that seals the optical element with respect to the support member; a sealing member that is provided to bond the lid member with the supporting member; and a case with a lens provided such that the lens is disposed on an optical path of light oscillated by the optical element, wherein the case with the lens is opposed in an optical axis direction of light passing through the lens to and in contact with the supporting member.

11 Claims, 10 Drawing Sheets

OPTICAL MODULE AND METHOD FOR MANUFACTURING THE SAME

The entire disclosure of Japanese Patent Application No. 2006-024558, filed Feb. 1, 2006 is expressly incorporated by reference herein.

BACKGROUND

1. Technical Field

The present invention relates to optical modules and methods for manufacturing the same.

2. Related Art

When optical elements such as light emitting elements and photodetecting elements are damaged by external environmental factors such as dust and moisture, their performance may be deteriorated. In order to prevent the deterioration of performance, methods to seal an optical element inside a package have been developed. For example, Japanese translation of international patent application JP-T-2002-534813 describes a sealing method in which an adhesive layer and a metal layer are formed in a manner to cover optical devices on a substrate.

When an optical element is optically coupled to other devices such as an optical fiber, relative position of the optical element and a focusing lens in their optical axis direction must be precisely adjusted in order to obtain good coupling coefficient. However, it is difficult to precisely adjust mutual position of the optical element and the focusing lens because of various reasons, for example, because the structure of the package that stores the optical element may not be precisely formed.

SUMMARY

In accordance with an advantage of some aspects of the present invention, it is possible to provide optical modules and methods for manufacturing the same in which relative position of an optical element and a focusing lens in their optical axis direction can be precisely adjusted.

An optical module in accordance with an embodiment of the invention includes: an optical element; a support member for supporting the optical element; a lid member that seals the optical element in the support member; a sealing member that is provided to bond the lid member with the supporting member; and a case with a lens provided such that the lens is disposed on an optical path of light oscillated by the optical element, wherein the case with the lens is opposed in an optical axis direction of light passing through the lens to and in contact with the supporting member.

According to the optical module in accordance with the embodiment described above, the case with a lens is affixed in contact with the supporting member. As a result, the distance between the case with a lens and the optical element can be adjusted with precision.

In the optical module in accordance with an aspect of the embodiment of the invention, the supporting member may be formed from an enclosure having a base section and a frame section provided on the base section, the optical element may be provided inside the frame section, the lid member may be composed of a transparent substrate provided above the frame section, the sealing member is provided in a portion of an upper surface of the frame section, and the case with a lens can be in contact with another portion of the upper surface of the frame section.

In the optical module in accordance with an aspect of the embodiment of the invention, the frame section may have a rectangular outer circumference, and the case with a lens may contact with end sections along a pair of parallel sides in an outer circumferential section of the frame section.

In the optical module in accordance with an aspect of the embodiment of the invention, the frame section may have a rectangular outer circumference, and the case with a lens may be in contact with corner sections of the frame section.

In the optical module in accordance with an aspect of the embodiment of the invention, the support member may be formed from an enclosure having a base section and a frame section provided on the base section, the optical element may be provided inside the frame section, the lid section may be composed of a transparent substrate provided above the frame section, the sealing member may be provided on an upper surface of the frame section, and the case with a lens may be in contact with an upper surface of the base section outside the frame section.

The optical module in accordance with an aspect of the embodiment of the invention may further include adhesive provided between a side surface of the frame section on its outer side and the case with a lens.

In the optical module in accordance with an aspect of the embodiment of the invention, the transparent substrate may be composed of a glass substrate, and the sealing member may be composed of low melting-point glass.

The optical module in accordance with an aspect of the embodiment of the invention may further include a spacer inside the frame section and above the base section, wherein the optical element may be provided above the spacer.

The case with a lens may be a connector with a lens having a sleeve and a lens.

A method for manufacturing an optical module in accordance with an embodiment of the invention pertains to a method for manufacturing an optical module equipped with an optical element, the method including the steps of: (a) preparing a support member for supporting an optical element; (b) affixing the optical element to the supporting member; (c) providing a sealing member on an upper surface of the supporting member and around the optical element; (d) disposing a lid member for sealing the optical element above the sealing member and affixing the lid member to the supporting member; and (e) affixing a case with a lens to the supporting member, wherein, in the step (e), the case with the lens is affixed to the supporting member such that the lens is disposed on an optical path of light oscillated by the optical element, and the case with the lens is disposed opposite in an optical axis direction of light passing through the lens to and in contact with the supporting member.

The method for manufacturing an optical module equipped with an optical element may further include, after the step (a), the steps of (f) providing a spacer on the supporting member; and (g) pressing the spacer to cause plastic deformation therein.

DESCRIPTION OF EXEMPLARY EMBODIMENTS

Preferred embodiments of the invention are described below with reference to the accompanying drawings.

1. Optical Module

Figure 1:
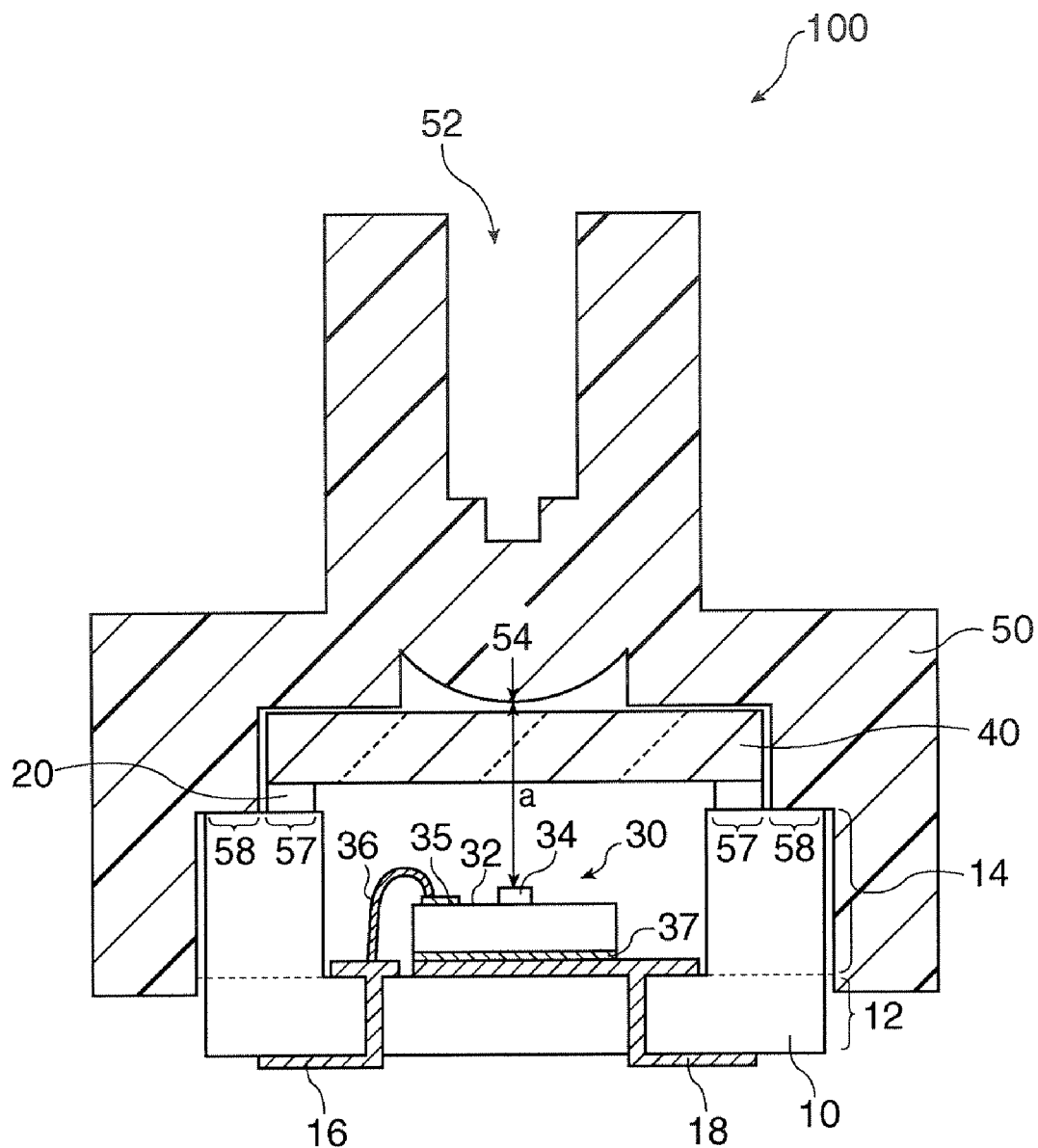
FIG. 1 is a schematic cross-sectional view of an optical module in accordance with an embodiment of the invention.

First, the structure of an optical module 100 in accordance with an embodiment of the invention is described. FIG. 1 is a schematic cross-sectional view of the optical module 100 in accordance with the present embodiment.

The optical module 100 includes an enclosure (supporting member) 10, a sealing member 20, an optical element 30, a lid member 40, and a connector with a lens 50 that is an example of a case with a lens. The enclosure 10 has a base section 12 and a frame section 14 provided on the base section 12. The base section 12 and the frame section 14 are composed of ceramics. Also, the enclosure 10 further includes a first wiring 16 and a second wiring 18. The first wiring 16 and the second wiring 18 are formed from an upper surface of the base section 12 through holes formed therein to a lower surface of the base section 12. The second wiring 18 can be formed on the upper surface of the base section 12 in a region where the optical element 30 is to be bonded. The sealing member 20 is formed in a region 57 in a portion of the upper surface of the frame section 14 and has, for example, a rectangular frame configuration. The sealing member 20 bonds the lid member 40 and the enclosure 10 together, and can air-tightly seal the optical element 30.

The optical element 30 may be a light emitting element or a photodetecting element, and is provided inside the enclosure 10, more specifically, on the upper surface of the base section 12 inside the frame section 14. The optical element 30 includes a substrate 32, and an optical component 34 provided on the substrate 32. The optical component 34 may be a portion that emits or receives light. The optical component 34, when it is a light emitting element, may be a resonator section of a surface-emitting type semiconductor laser. The optical component 34, when it is a photodetecting element, may be a photoabsorption region. The optical element 30 further includes a first electrode 37 and a second electrode 35 for driving the optical element 30. The first electrode 37 is formed on a surface of the substrate 32 on the side of the second wiring 18. The second electrode 35 is formed on the substrate 32. A wire 36 electrically connects the second electrode 35 with the first wiring 16. It is noted that the first electrode 37 may be formed on the upper surface of the substrate 32.

The lid member 40 is provided over the sealing member 20 in a manner to cover an opening section of the enclosure 10 surrounded by the frame section 14, but not to cover a portion above an end section of the frame section 14 on its outside or in its entirety (the other section). The lid member 40 may be composed of a transparent substrate that transmits light emitted from or received by the optical element 30, and may be composed of, for example, a glass substrate.

The connector with a lens 50 has a lens section 54 and a sleeve 52, which are formed in one piece, as shown in FIG. 1. The connector with a lens 50 may be formed from, for example, resin. For example, a ferrule may be inserted in the sleeve 52. The lens section 54 is provided above the optical element 30, and focuses light emitted from the optical component 34 or light from outside. The connector with a lens 50 is provided above the lid member 40 in a manner to be in contact with the enclosure 10.

Figure 2:
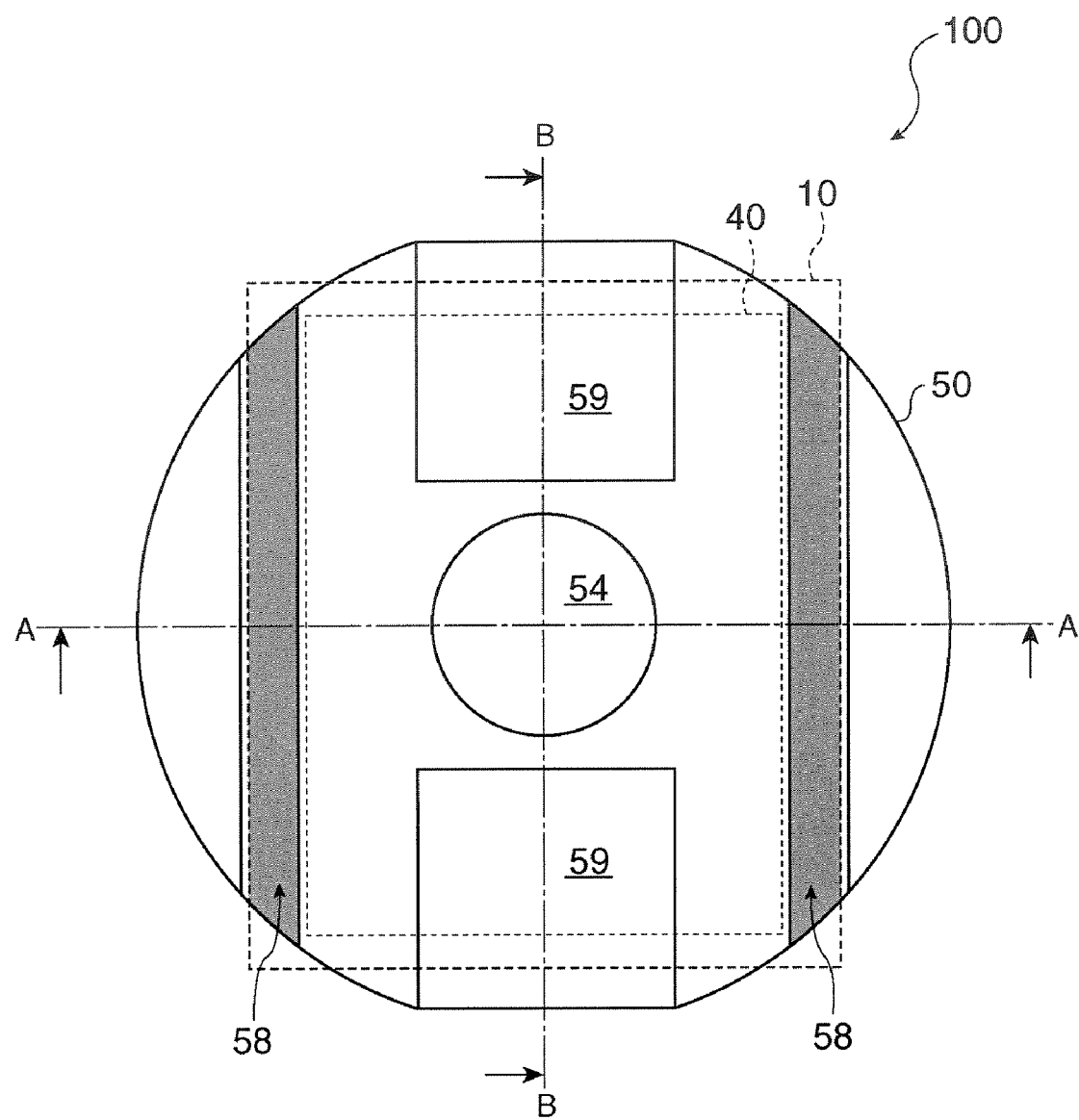
FIG. 2 is a schematic bottom plan view of a connector with a lens in accordance with an embodiment of the invention.
Figure 3:
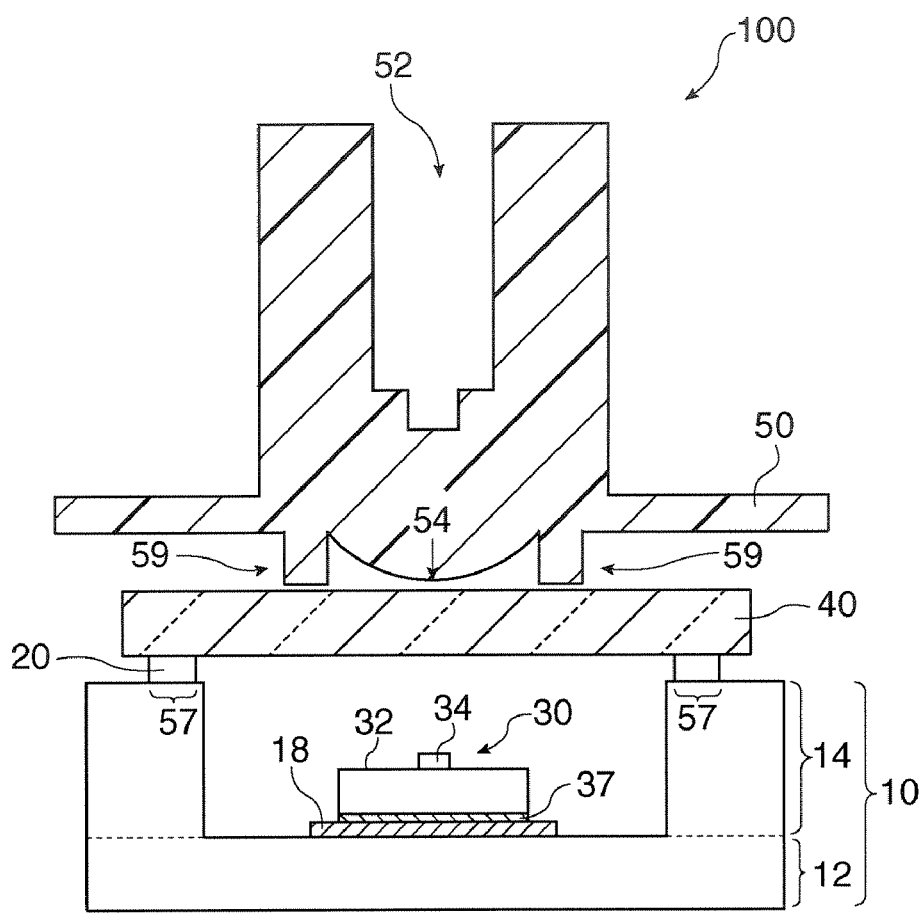
FIG. 3 is a schematic cross-sectional view of an optical module in accordance with an embodiment of the invention.

The configuration of the connector with a lens 50 is described in greater detail with reference to FIG. 2 and FIG. 3. FIG. 2 is a schematic bottom plan view of the connector with a lens 50, and FIG. 3 is a cross-sectional view of the optical module 100. FIG. 1 is a cross-sectional view taken along a line A-A of FIG. 2, and FIG. 3 is a cross-sectional view taken along a line B-B of FIG. 2. Also, in FIG. 2, the outline of the enclosure 10 and the lid member 40 are indicated by broken line, and only the configuration of the connector with a lens 50 as viewed from below is indicated by solid line.

First, the connector with a lens 50 is disposed opposite to the enclosure 10 in an optical axis direction of light passing through the lens section 54, and is in contact with the enclosure 10 at a contact surface 58. The contact surface 58 is provided in a region (other portion) different from the region 57 described above, and may preferably be provided at two or more locations. Also, the contact surface 58 may be in a frame shape that covers an outer circumferential end portion of the frame section 14. In accordance with the present embodiment, the contact surface 58 is provided on an upper surface of the frame section 14 of the enclosure 10, and in end sections along a pair of parallel sides at an outer circumferential end portion of the frame section 14, as shown in FIG. 2. In this instance, the region 57 where the sealing member 20 is provided can be provided inside the contact surface 58. Also, the region 57 may be provided along the pair of parallel sides inside the contact surfaces 58, and may also be provided on an upper surface along a pair of the other parallel sides.

Also, the connector with a lens 50 has recessed sections 59 along sides thereof different from the sides where the contact surfaces 58 are provided, as shown in FIG. 2 and FIG. 3. By this, hooks to retain the position of the enclosure 10 can be used, for example, when the enclosure 10 is fitted in the connector with a lens 50, when the first wiring 16 or the second wiring 18 is connected to an external wiring, and the like. The hooks can pinch and affix the enclosure 10 and the lid member 40 together.

According to the present embodiment, the connector with a lens 50 is disposed opposite to the enclosure 10 in an optical axis direction of light passing through the lens section 54, and is in contact with the enclosure 10 at the contact surfaces 58. Accordingly, by adjusting the shape of the connector with a lens 50 and/or the height of the enclosure 10, the distance a between the lens section 54 and the optical component 34 of the optical element 30 can be precisely adjusted. By this, the coupling efficiency of light emitted from or received by the optical element 30 with an external element can be improved.

Furthermore, in accordance with the present embodiment, because the contact surfaces 58 are provided in end sections along a pair of parallel sides at an outer circumferential end section of the frame section 14, the surface of the lens section 54 can be adjusted to an appropriate orientation with respect to the optical axis direction of light oscillated by the optical element 30, by adjusting the shape of the connector with a lens 50. By this, the coupling efficiency of light emitted from or received by the optical element 30 with an external element can be improved.

2. Method for Manufacturing Optical Module

First, a method for manufacturing an optical module in accordance with an embodiment of the invention is described. FIGS. 4-7 are cross-sectional views showing steps of the method for manufacturing an optical module, which correspond to the cross-sectional view of FIG. 1, respectively.

Figure 4:
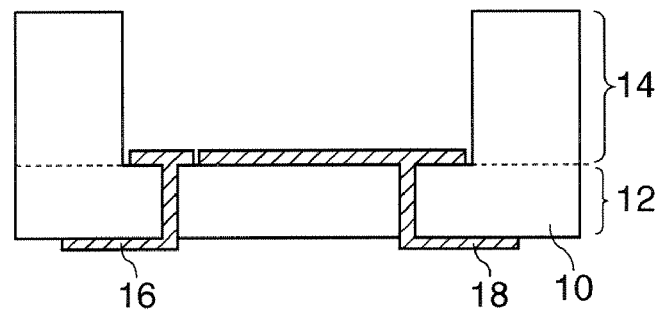
FIG. 4 is a cross-sectional view schematically showing a step of a method for manufacturing an optical module in accordance with an embodiment of the invention.

(1) First, as shown in FIG. 4, an enclosure 10 is prepared. A plate member composing a base section 12 and a frame member composing a frame section 14 may be formed from, for example, a single layer of green sheet or a laminated multi-layer of green sheets of green ceramics containing alumina. The frame member composing the frame section 14 may be formed from a green sheet with a hole formed therein. The green sheet can be wrought into a desired configuration by a punching mold, a punching machine or the like. By adjusting the number of green sheets used for the base section 12 and the frame section 14, the size of the enclosure 10 can be adjusted. Also, wirings may be formed by printing or the like on the surface of each of the green sheets. The plate member composing the base section 12 and the frame member composing the frame section 14 are laminated, and sintered into one piece, whereby the enclosure 10 can be formed. It is noted that a surface treatment may be applied to an upper surface of the frame section 14 of the enclosure 10 so that the enclosure 10 and a seal member 20 to be described below would be readily adhered to each other.

A first wiring 16 and a second wiring 18 are formed with conductive material, after forming holes in the plate member composing the base section 12.

Figure 5:
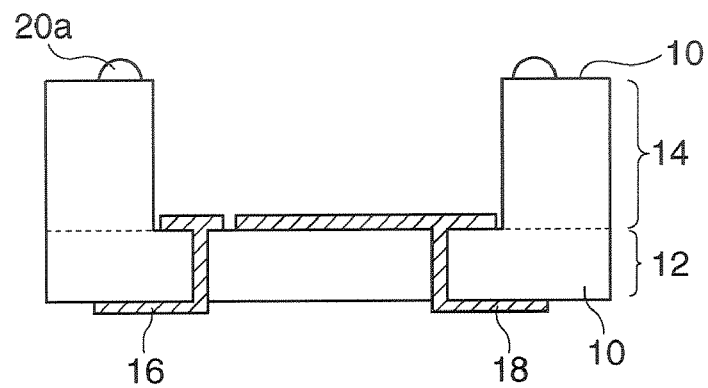
FIG. 5 is a cross-sectional view schematically showing a step of the method for manufacturing an optical module in accordance with the embodiment of the invention.

(2) Next, as shown in FIG. 5, a sealing member 20 is provided in a portion (regions 57) of the upper surface of the frame section 14. The sealing member 20 is provided to bond a lid member 40 to be described below and the enclosure 10. The sealing member 20 may be composed of any material that bonds the enclosure 10 and the lid member 40 without any particular limitation, may be composed of thermoplastic insulation material or metal material, and may be composed of, for example, a preform of low melting point glass.

Figure 6:
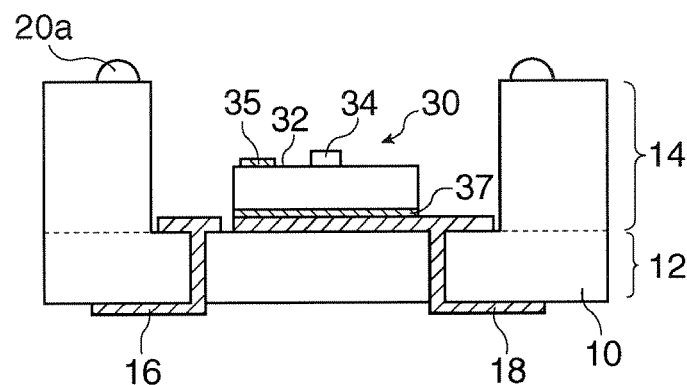
FIG. 6 is a cross-sectional view schematically showing a step of the method for manufacturing an optical module in accordance with the embodiment of the invention.

(3) Next, as shown in FIG. 6, an optical element 30 and the enclosure 10 are bonded together. Concretely, the optical element 30 is bonded onto the second wiring 18. First, a bonding member 24 is coated, and the optical element 30 is disposed on an upper surface of the bonding member 24, and die bonding is conducted while an appropriate load is applied downwardly. As the bonding member 24, for example, silver paste may be used.

After the silver paste used as the bonding member 24 is solidified, wire bonding of a wire 36 is conducted using a known method. The wire 36 electrically connects the second electrode 35 formed on the substrate 32 with the first wiring 16.

Figure 7:
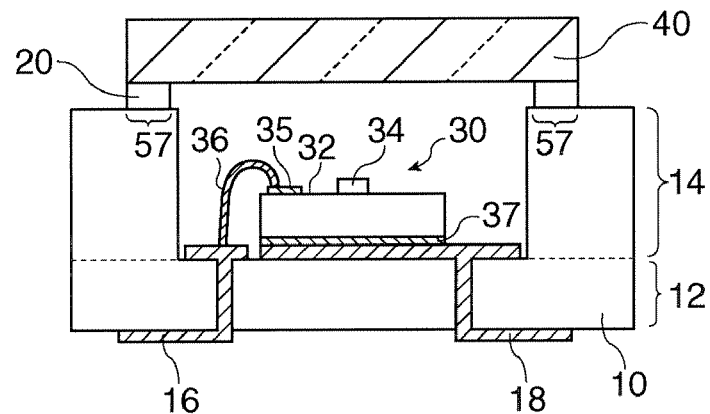
FIG. 7 is a cross-sectional view schematically showing a step of the method for manufacturing an optical module in accordance with the embodiment of the invention.

(4) Next, as shown in FIG. 7, the lid member 40 and the enclosure 10 are bonded together by the sealing member 20. While the lid member 40 is pressed in a direction of the base section 12 (downwardly), the sealing member 20 is heated. For example, laser light may be irradiated from above the sealing member 20 to thereby heat the sealing member 20. When a glass substrate is to be used as the lid member 40, low-melting point glass may be used as the material of the sealing member 20 whereby adhesion between the sealing member 20 and the lid member 40 can be improved.

(5) Next, as shown in FIG. 1, the connector with a lens 50 is mounted on the enclosure 10. The connector with a lens 50 may be composed of resin. Concretely, the connector with a lens 50 before being solidified is pressed against the enclosure 10 at a contact surface 58, and bonded and solidified, whereby the connector with a lens 50 can be mounted on the enclosure 10. It is noted that adhesive may be coated on outside surfaces of the enclosure 10, and then the connector with a lens 50 may be mounted on the enclosure 10, or the connector with a lens 50 may be mounted by fitting in the enclosure 10.

By the process described above, the optical module 100 can be manufactured.

3. MODIFIED EXAMPLES

3.1. First Modified Example

Figure 8:
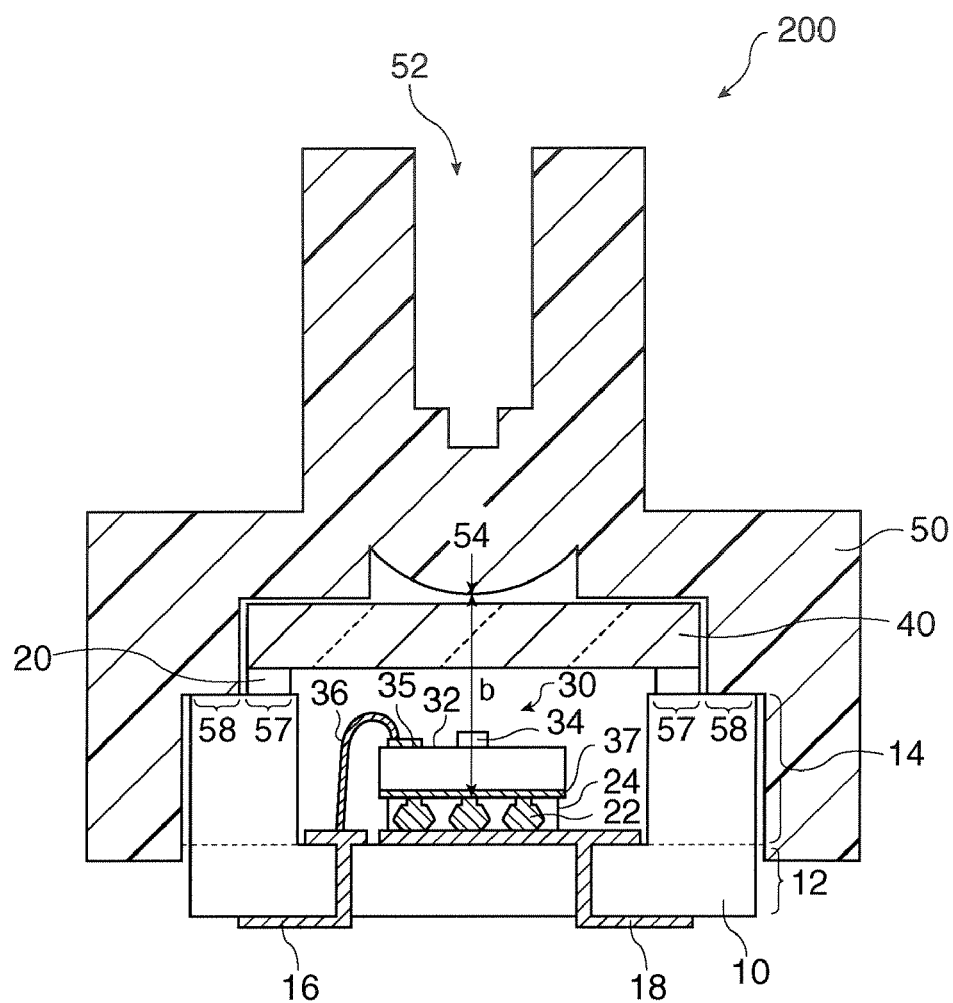
FIG. 8 is a schematic cross-sectional view of an optical module in accordance with a first modified example.
Figure 9:
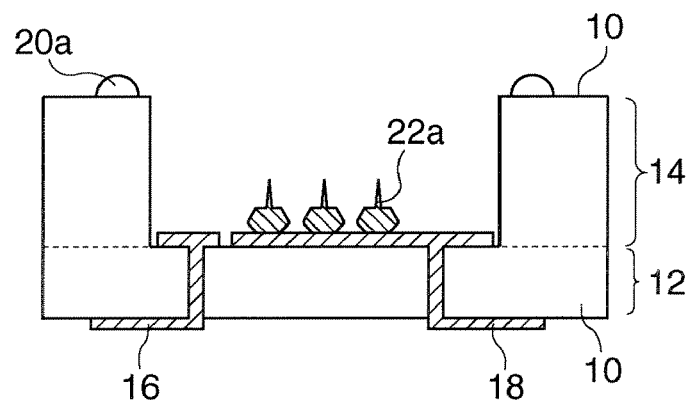
FIG. 9 is a cross-sectional view schematically showing a step of a method for manufacturing an optical module in accordance with the first modified example.
Figure 10:
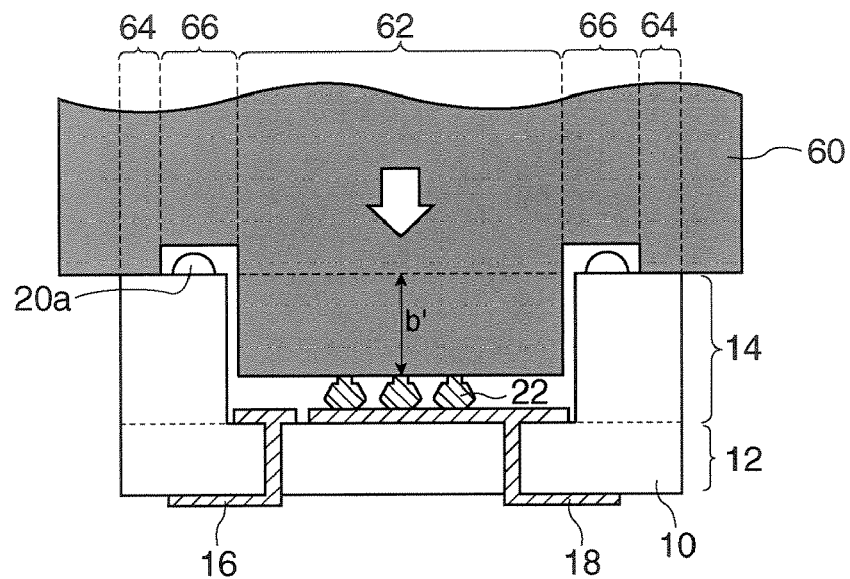
FIG. 10 is a cross-sectional view schematically showing a step of the method for manufacturing an optical module in accordance with the first modified example.

An optical module 200 in accordance with a first modified example is described. FIG. 8 is a schematic cross-sectional view of an optical module in accordance with the first modified example. FIGS. 9 and 10 are views showing steps of the method for manufacturing the optical module in accordance with the first modified example.

The optical module 200 in accordance with the first modified example is different from the optical module 100 in accordance with the embodiment described above in that the optical module 200 further includes a spacer 22. The spacer 22 is provided inside the enclosure 10, in other words, on an upper surface of the base section 12, and inside the frame section 14. The optical element 30 is provided on an upper surface of the spacer 22. A first electrode 37 is formed on a surface of the substrate 32 on the side of a second wiring 18, and is electrically connected through the spacer 22 to the second wiring 18.

The optical module 200 can be formed by the following manufacturing process. First, a sealing member 20a is formed on an upper surface of the enclosure 10, and then a spacer 22a is formed above the base section 12 inside the enclosure 10, as shown in FIG. 9. The spacer 22a has a protruded section protruding upwardly. The spacer 22a is composed of a material that is plastically deformable, and may be composed of, for example, ball bumps. The ball bumps may be formed through conducting a first bonding of balls formed at tips of capillaries to the enclosure 10 by a wire bonder, and cutting the wires protruding from the balls. It is noted that the ball bumps are only first-bonded to the second wiring 18 formed on the base section 12. The spacer 22a may preferably be composed of a metal material, and may be composed of gold. The ball bumps are formed in a region where an optical element 30 is provided. For example, when the size of the bottom surface of the optical element 30 is 0.3 mm×0.3 mm, (3×3) ball bumps each having a diameter of 0.1 mm may be formed.

Next, as shown in FIG. 10, a height adjusting jig 60 is used to press the spacer 22a to cause plastic deformation. The height adjusting jig 60 includes a first section 62 opposed to the spacer 22a, a second section 64 opposed to a region of the upper surface of the frame section 14 where the sealing member 20a is not formed, and a third section 66 opposed to a region of the upper surface of the frame section 14 where the sealing member 20a is formed. As shown in FIG. 10, the height adjusting jig 60 has a convex portion (the first section 62) at its central area, and a concave portion (the third section 66) around the convex portion.

An upper surface of the first section 62 is located at a position higher than an upper surface of the second section 64 and the third section 66. The height adjusting jig 60 is formed such that a difference between the upper surface of the first section 62 and the upper surface of the second section 64 is set to a specified length b'. The height adjusting jig 60 may be composed of any material that is harder than the sealing member 20 and the spacer 22a, without any particular limitation.

Concretely, the height adjusting jig 60 is used to press the spacer 22a and the sealing member 20 in a direction of an arrow indicated in FIG. 10. More concretely, the spacer 22a is pressed by the first section 62, until the second section 64 is abutted against the upper surface of the frame section 14, thereby limiting the amount of compression of the spacer 22a. As a result, the spacer 22a is squashed and plastically deformed whereby a spacer 22 is formed, and the height difference between the upper surface of the frame section 14 and the upper surface of the spacer 22 can be set to the length b'.

Next, by the method described above, a bonding member 24, such as, for example, silver paste is coated in a manner to fill gaps between the spacers 22, and the optical element 30 is bonded onto the spacers 22. Succeeding steps are generally the same as those of the manufacturing method applied to the optical module 100 described above, and their description is omitted.

In the method for manufacturing the optical module 200 in accordance with the first modified example, a height adjusting jig 60 is used to squash the spacers 22a, and then an optical element 30 is disposed on the spacers 22a. By this, as shown in FIG. 8, the height difference between the lower surface of the optical element 30 (the upper surface of the spacers 22) and the lens section 54 can be precisely adjusted to a length b. In this manner, by precisely adjusting the distance between the optical element 30 and the lens section 54, the optical module 200 can have an increased controllability of the optical path. Accordingly, the optical coupling efficiency of the optical element 30 with an external device such as an optical fiber can be improved.

Also, in the method for manufacturing an optical module 200 in accordance with the first modified example, the spacer 22a has a protruded section, such that the spacer 22a would readily be plastically deformed by the height adjusting jig 60. Accordingly, the spacer 22 having an appropriate height can be formed. Also, the spacer 22a is generally composed of a conductive material having a high thermal conductivity, such that its heat dissipation can be increased. Also, the first electrode 37 is provided on a surface on the side of the spacer 22 (on the back surface of the optical element 30). In this manner, when the electrode is provided on the back surface of the optical element 30, and the spacer 22a is composed of a conductive material, the second wiring 18 and the optical element 30 can be electrically connected to each other, and therefore the step of wire bonding from the upper surface of the optical element 30 to the second wiring 18 can be omitted.

Other details of the structure of the optical module 200 and its manufacturing process are generally the same as those of the structure of the optical module 100 and its manufacturing process described above, and therefore their description is omitted.

It is noted that, in the method for manufacturing an optical module in accordance with the first modified example, after the sealing member 20 is provided, the spacer 22a is then plastically deformed. Instead of the aforementioned process, the spacer 22a may be plastically deformed before the sealing member 20 is provided.

3.2. Second Modified Example

Figure 11:
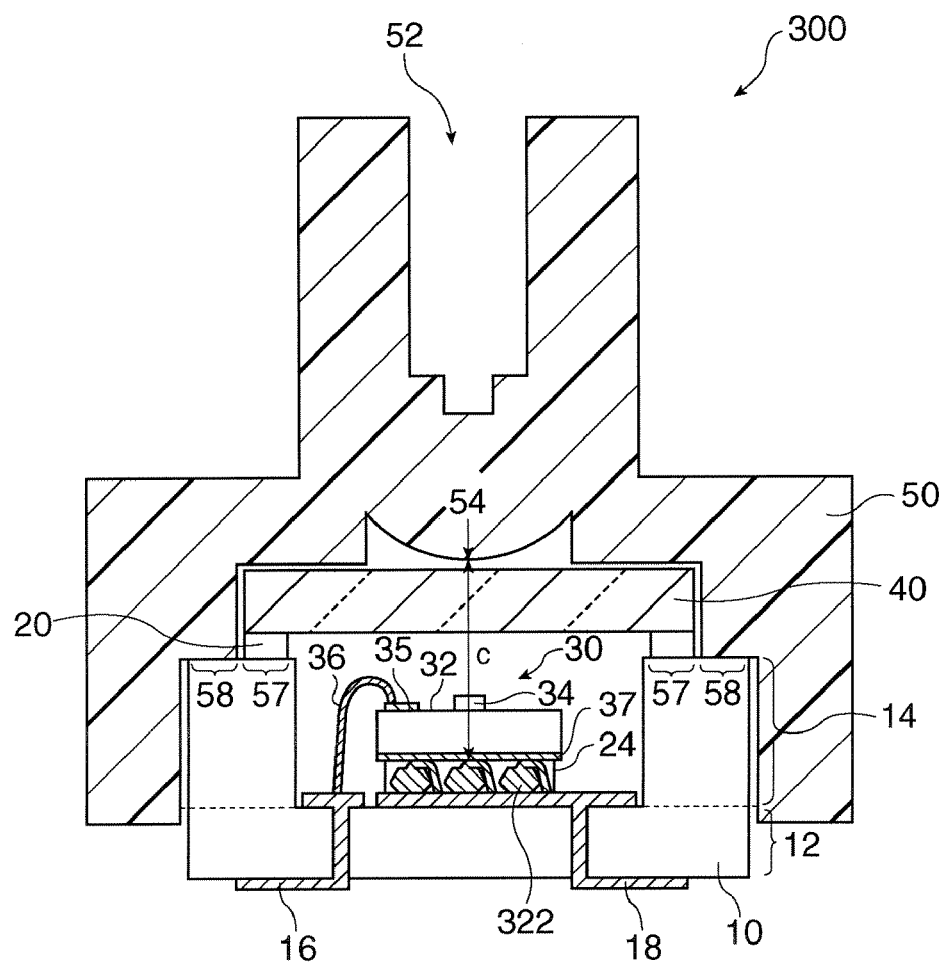
FIG. 11 is a schematic cross-sectional view of an optical module in accordance with a second modified example.

An optical module 300 in accordance with a second modified example is described. FIG. 11 is a schematic cross-sectional view of an optical module in accordance with the second modified example. The optical module 300 in accordance with the second modified example is different from the optical module 100 in accordance with the embodiment described above in that each of spacers 322 is connected to a second wiring 18 at two places.

The spacer 322 can be obtained through conducting a first bonding of a ball formed at a tip of a capillary onto the second wiring 18 by using a wire bonder, and conducting a second bonding of the other end of the wire onto the second wiring 18.

Like the first modified example described above, in the method for manufacturing the optical module 300 in accordance with the second modified example, a height adjusting jig 60 is used to squash the spacers 322, and then an optical element 30 is disposed on the spacers 322. By this, as shown in FIG. 11, the height difference between the lower surface of the optical element 30 (the upper surface of the spacer 322) and the lens section 54 can be precisely adjusted to a length c. In this manner, by precisely adjusting the distance between the optical element 30 and the lens section 54, the optical module 300 can have an increased controllability of the optical path, and an improved optical coupling efficiency of the optical element 30 with an external device such as an optical fiber.

Also, the spacer 322 is bonded to the second wiring 18 at two places, such that the optical module 300 can have reduced electrical resistance, and improved heat dissipation.

Other details of the structure of the optical module 300 and its manufacturing process are generally the same as those of the structure of the optical module 200 and its manufacturing process described above, and therefore their description is omitted.

3.3. Third Modified Example

Figure 12:
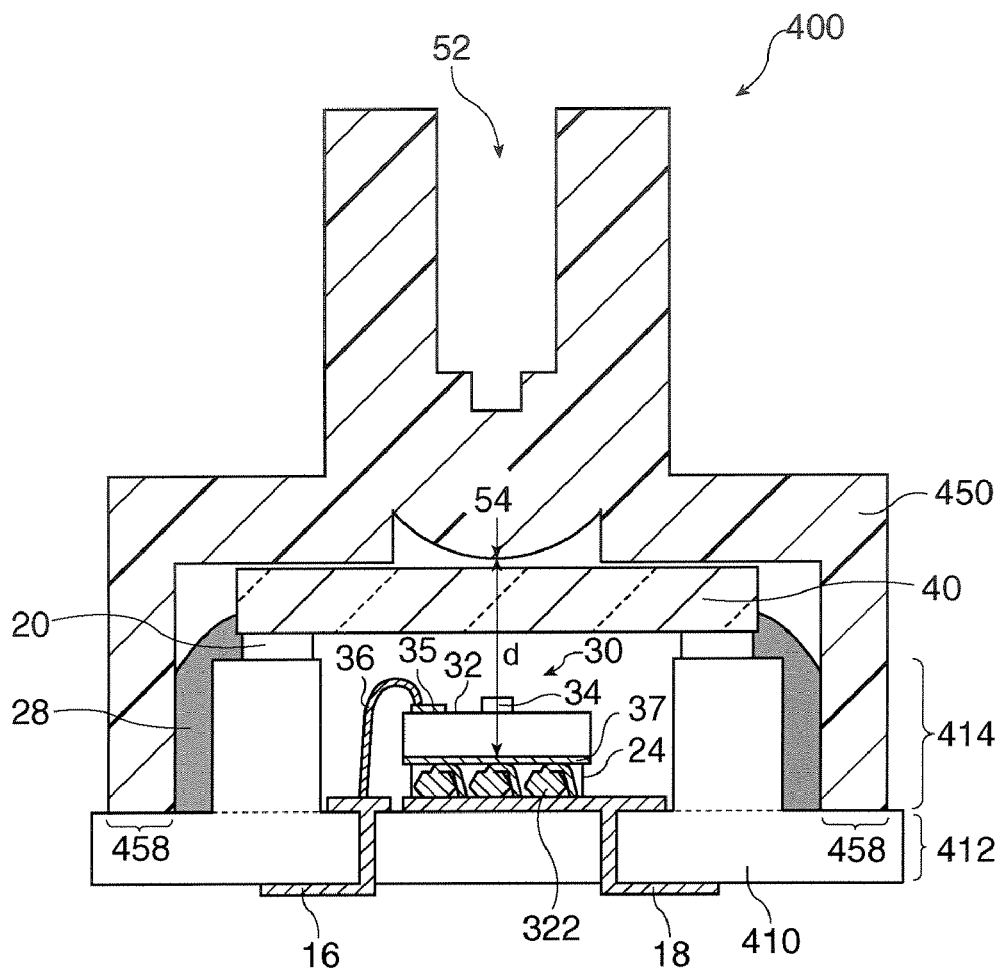
FIG. 12 is a schematic cross-sectional view of an optical module in accordance with a third modified example.
Figure 13:
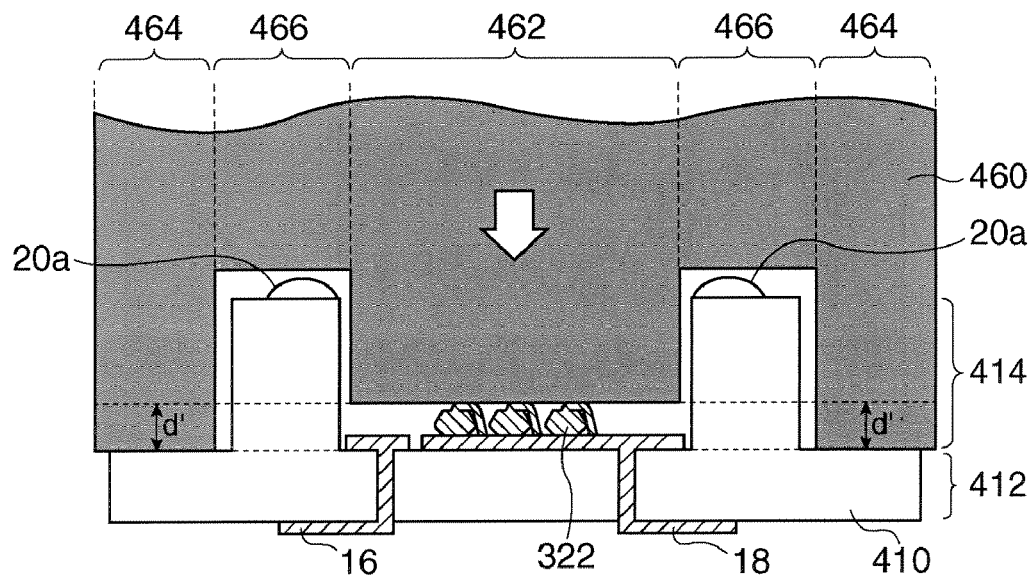
FIG. 13 is a cross-sectional view schematically showing a step of a method for manufacturing an optical module in accordance with the third modified example.

An optical module 400 in accordance with a third modified example is described. FIG. 12 is a schematic cross-sectional view of the optical module in accordance with the third modified example. FIG. 13 is a view showing a step of a method for manufacturing the optical module in accordance with the third modified example.

The optical module 400 in accordance with the third modified example is different from the optical module 100 in accordance with the embodiment described above in that a base section 412 and a connector with a lens 450 are in contact with each other. Also, the optical module in accordance with the third modified example includes spacers 322 like the second modified example.

An enclosure 410 (supporting member) of the optical module 400 in accordance with the third modified example has a base section 412, and a frame section 414 provided on the base section 412. The frame section 414 is provided such that its outer side surfaces are inside the outer side surfaces of the base section 412, as shown in the cross-sectional view in FIG. 12. In other words, the base section 412 has a shape that protrudes outwardly from the frame section 414.

The connector with a lens 450 of the optical module 400 in accordance with the third modified example is disposed opposite to the enclosure 410 in an optical axis direction of light passing through the lens section 54, and is in contact with the enclosure 410 at contact surfaces 458. The contact surfaces 458 are provided outside of the frame section 414 of the enclosure 410 and on an upper surface of the base section 412, and may be provided in a shape, for example, at two places along a pair of parallel sides, as shown in FIG. 12.

According to the connector with a lens 450 of the optical module 400 in accordance with the third modified example, its configuration can be simplified more than the connector with a lens 50 of the optical module 100 described above.

A method for manufacturing an optical module in accordance with the third modified example is different from the method for manufacturing an optical module in accordance with the first modified example or the second modified example in that a height adjusting jig used in the method of the third modified example is different in shape. As shown in FIG. 13, a height adjusting jig 460 has a first section 462 opposed to the base section 412 inside the frame section 414, a second section 464 opposed to the base section 412 outside of the frame section 414 and has an upper surface higher than that of the first section 462, and a third section 466 opposed to the upper surface of the frame section 414 and has an upper surface lower than that of the first section 462.

By pressing the spacers 322 with the height adjusting jig 460, the difference between the height of the upper surface of the base section 412 and the height of the upper surface of the spacers 322 can be adjusted to a length d'. By this, as shown in FIG. 12, the height difference between the lower surface of the optical element 30 (the upper surface of the spacers 322) and the height of the lens section 54 can be precisely adjusted to a length d. In this manner, by precisely adjusting the distance between the optical element 30 and the lens section 54, the controllability of the optical path can be increased, and the optical coupling efficiency of the optical element 30 with an external device such as an optical fiber can be improved. Also, the optical module 400 in accordance with the third modified example may include adhesive 28, such that the connector with a lens 450 can be securely affixed to the enclosure 410.

Other details of the structure of the optical module 400 and its manufacturing process are generally the same as those of the structure of the optical module 200 and the optical module 300 and their manufacturing process described above, and therefore their description is omitted.

3.4. Fourth Modified Example

Figure 14:
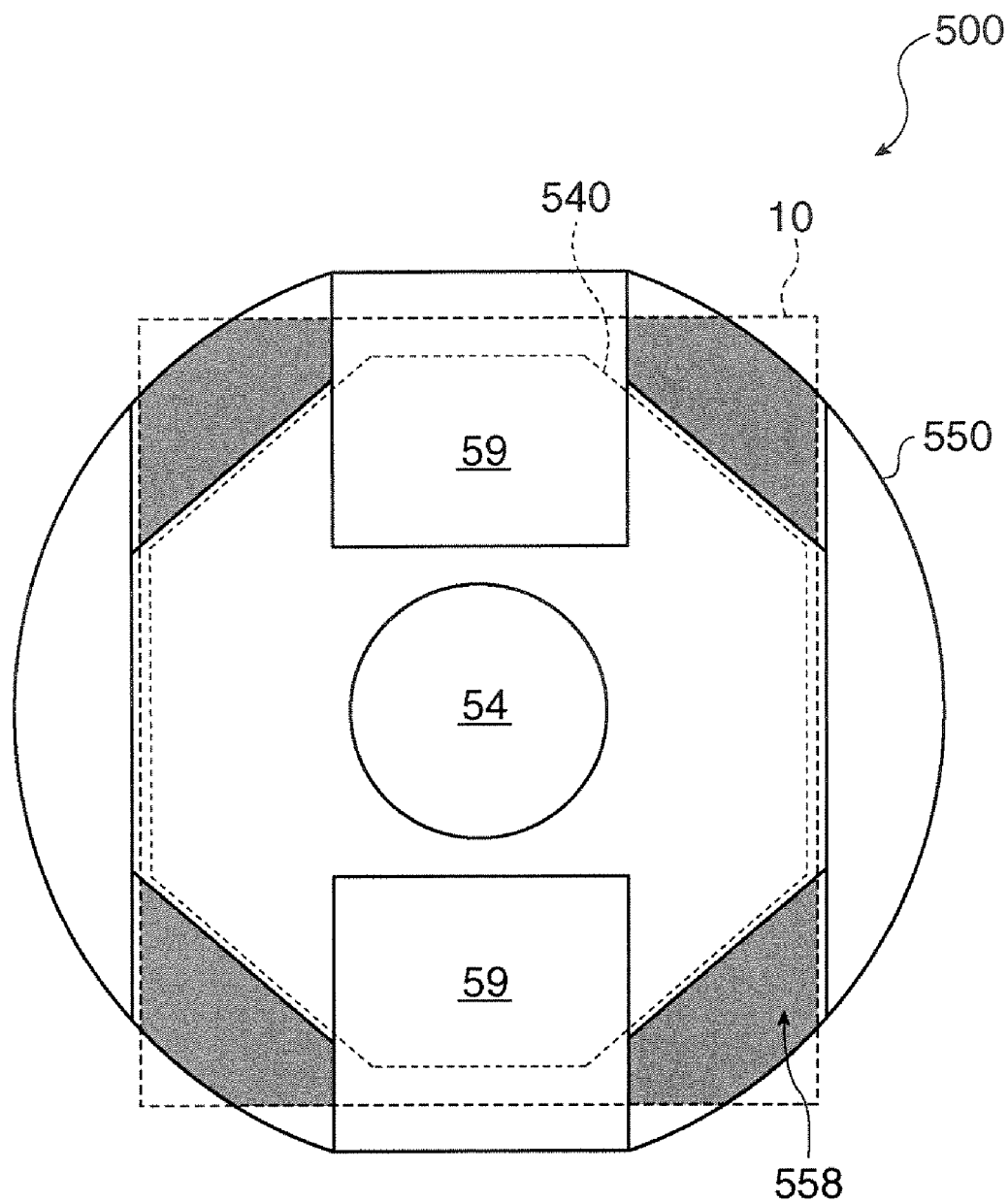
FIG. 14 is a schematic bottom plan view of a connector with a lens in accordance with a fourth modified example.

Next, an optical module 500 in accordance with a fourth modified example is described. FIG. 14 is a schematic bottom plan view of a connector with a lens 550 as viewed from below, and corresponds to FIG. 2. Also, in FIG. 14, the outline of an enclosure 10 and a lid member 540 is indicated in broken line, and only the configuration of the connector with a lens 550 as viewed from below is indicate in solid line.

The connector with a lens of the optical module 500 in accordance with the second modified example is different in its configuration from that of the optical module 100 of the embodiment described above. The connector with a lens 550 is disposed opposite to an enclosure 10 in an optical axis direction of light passing through a lens section 54, and is in contact with the enclosure 10 at contact surfaces 558. In the fourth modified example, a frame section 14 has a rectangular shape, and the contact surfaces 558 are provided on an upper surface of the frame section 14 of the enclosure 10, and in regions including the corner sections among the outer circumferential section of the frame section 14. The contact surfaces 558 are formed to match with the height and position of the upper surface of the frame section 14 of the enclosure 10.

In this manner, the contact surfaces 558 may be in any shape that allows the connector with a lens to be in contact with the frame section 14 of the enclosure 10 or the upper surface of the base section 10 without any particular limitation, and may be appropriately changed according to, for example, the shape of the optical element 30, the manufacturing process and the like.

Other details of the structure of the optical module 500 and its manufacturing process are generally the same as those of the structure of the optical module 100 and its manufacturing process described above, and therefore their description is omitted.

3.5. Fifth Modified Example

Figure 15:
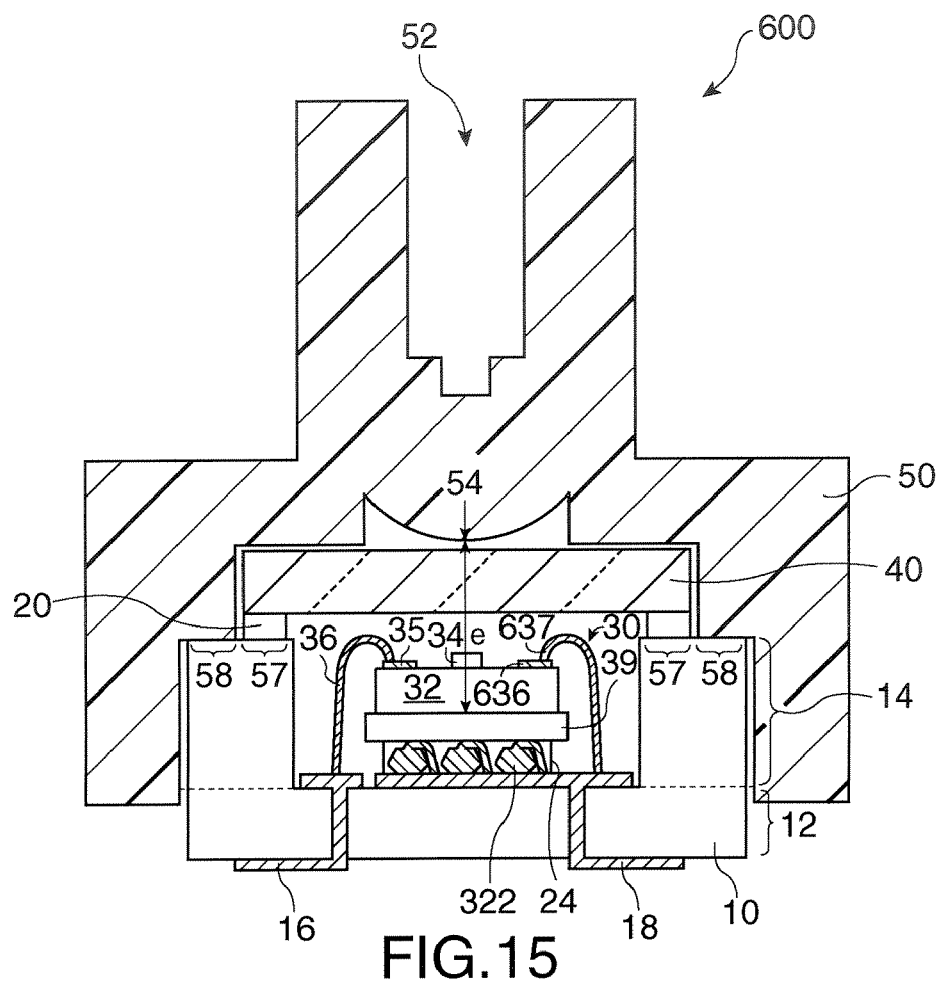
FIG. 15 is a schematic cross-sectional view of an optical module in accordance with a fifth modified example.
Figure 16:
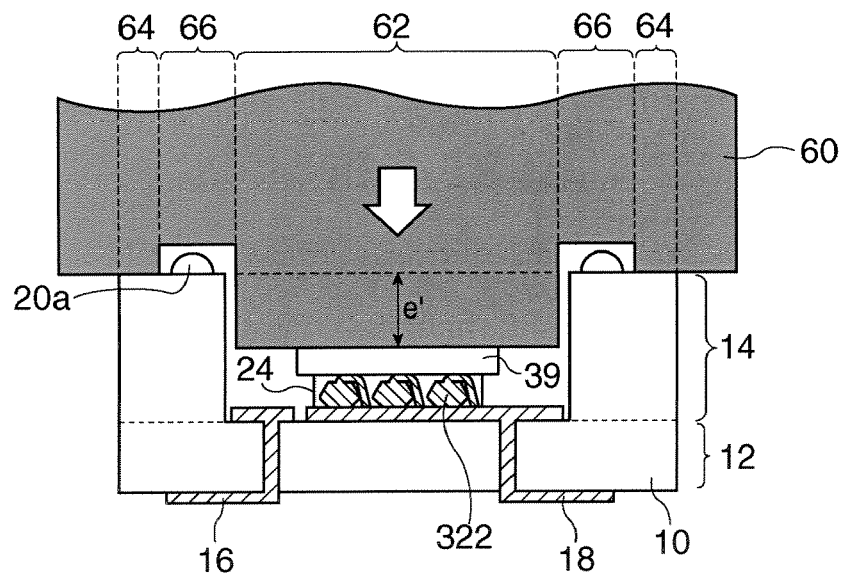
FIG. 16 is a cross-sectional view schematically showing a step of a method for manufacturing an optical module in accordance with the fifth modified example.

An optical module 600 in accordance with a fifth modified example is described. FIG. 15 is a schematic cross-sectional view of the optical module in accordance with the fifth modified example. FIG. 16 is a view showing a step of a method for manufacturing the optical module in accordance with the fifth modified example.

An optical module 500 in accordance with the fifth modified example further includes a submount 39, and therefore is different from the optical module 100 in accordance with the embodiment described above. The submount 39 is provided between an optical element 30 and a base section 12 of an enclosure 10. In the fifth modified example, spacers 322 are provided like the second modified example, and therefore the submount 39 may be provided between the optical element 30 and spacers 322.

In a manufacturing process that is applied to the optical module 600 in accordance with the fifth modified example, the spacers 22 or the spacers 322 described above may be used. In this modified example, for example, a method that uses the spacers 322 used in the second modified example is described. After disposing spacers 322 before being squashed are disposed on an upper surface of the enclosure 10, a bonding member 24 is coated in a manner to fill gaps between the spacers 322. Then, a submount 39 is bonded above the spacers 322. At this time, an appropriate load may be applied to the spacers 322 from above the submount 39. The load may preferably be smaller than a load that is to be applied later to squash the spacers 322. Also, a heat treatment or the like to solidify the bonding member 24 may be applied if necessary.

Then, the spacers 322 are squashed through the submount 39 by the height adjusting jig 60. Then, a bonding member such as silver paste (not shown) is coated over the submount 39, and an optical element 30 is bonded thereon. At this time, a load may be applied downwardly from above the optical element 30 to the extent that the spacers 322 would not be deformed. Also, a heat treatment or the like to solidify the bonding member may be applied if necessary.

Accordingly, the difference between the height of the upper surface of the submount 39 and the height of the upper surface of the enclosure 10 (the frame section 14) can be adjusted to a length e'. By this, as shown in FIG. 15, the height difference between the lower surface of the optical element 30 (the upper surface of the submount 39) and the height of the lens section 54 can be precisely adjusted to a length e. In this manner, by precisely adjusting the distance between the optical element 30 and the lens section 54, the controllability of the optical path can be increased, and the optical coupling efficiency of the optical element 30 with an external device such as an optical fiber can be improved.

Moreover, by appropriately adjusting the thickness of the submount 39, the mounting position of the optical element 30 can be made closer to the lens section 54. Also, if an insulation material is used as the submount 39, the spacers and the optical element 30 can be electrically insulated from each other. In this case, wires 637 may be used to electrically connect first electrodes 636 provided on an upper surface of the substrate 32 with the second wirings 18.

Other details of the structure of the optical module 600 and its manufacturing process are generally the same as those of the structure of the optical module 100 and its manufacturing process described above, and therefore their description is omitted.

3.6. Sixth Modified Example

Figure 17:
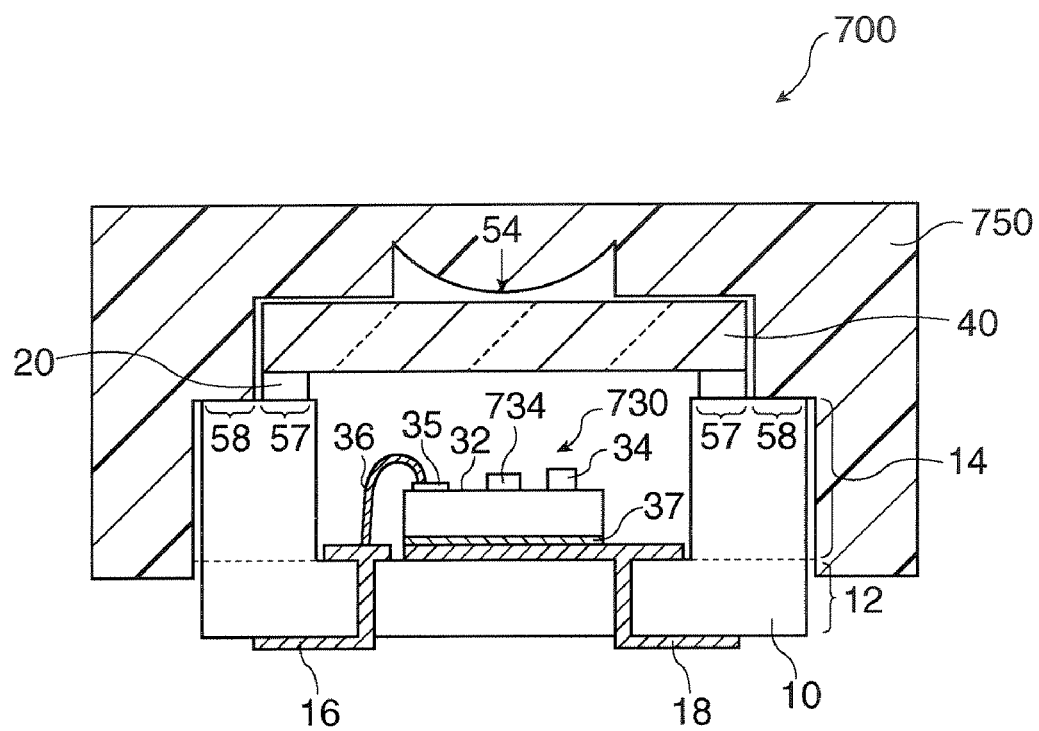
FIG. 17 is a schematic cross-sectional view of an optical module in accordance with a sixth modified example.

An optical module 700 in accordance with a sixth modified example is described. FIG. 17 is a schematic cross-sectional view of the optical module in accordance with the sixth modified example.

The optical module 700 in accordance with the sixth modified example has a case with a lens 750 that is different in shape from that of the optical module 100 in accordance with the embodiment described above. Concretely, the case with a lens 750 is different from the connector with a lens 50 in that it does not have a sleeve for inserting a ferrule or the like.

Also, the optical module 700 in accordance with the sixth modified example is different from the optical module 100 in accordance with the embodiment described above in that its optical element includes optical components at two places. Concretely, an optical element 730 of the fifth modified example includes a light emitting element 34 and a photodetecting element 734. The photodetecting element 734 can detect light coming from outside. For example, when the light emitting element 34 emits light, and an object to be measured reflects the light, the reflected light can be detected by the photodetecting element 734. In this manner, as the optical module 700 is equipped with the light emitting element 34 and the photodetecting element 734, the optical module 700 can function as an independent sensor without connecting to an optical fiber or the like.

Other details of the structure of the optical module 700 and its manufacturing process are generally the same as those of the structure of the optical module 100 and its manufacturing process described above, and therefore their description is omitted.

3.7. Seventh Modified Example

Figure 18:
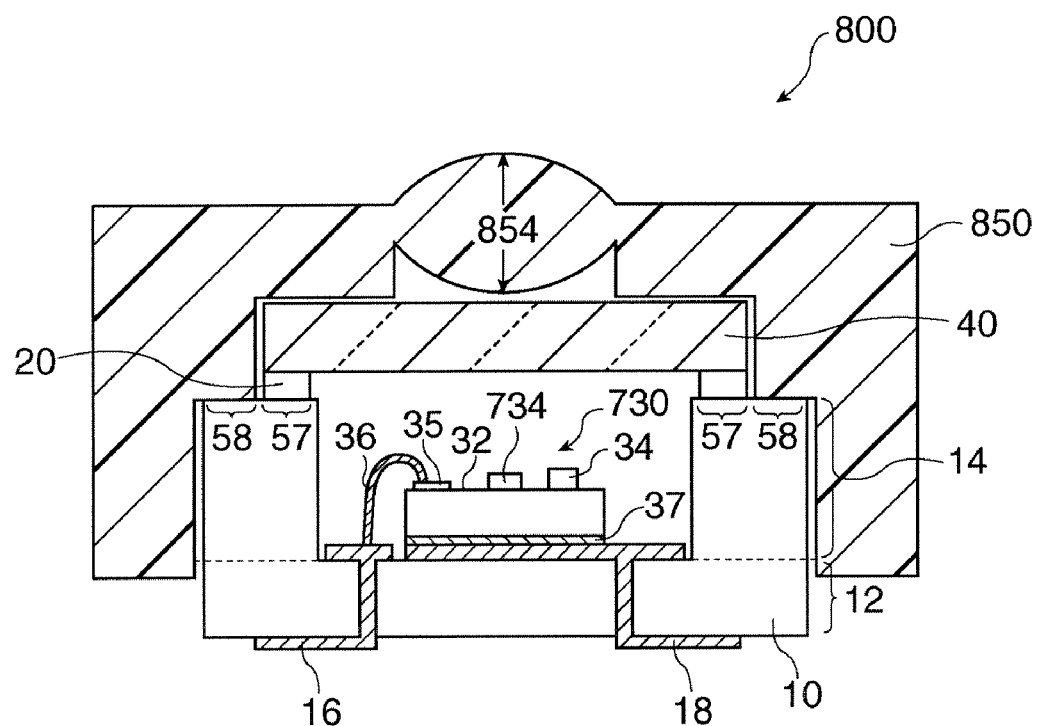
FIG. 18 is a schematic cross-sectional view of an optical module in accordance with a seventh modified example.

An optical module 800 in accordance with a seventh modified example is described. FIG. 18 is a schematic cross-sectional view of the optical module in accordance with the seventh modified example.

The optical module 800 in accordance with the seventh modified example has a case with a lens 850 that is different in shape from that of the optical module 100 in accordance with the embodiment described above. Concretely, the case with a lens 850 is different from the connector with a lens 50 in that it does not have a sleeve for inserting a ferrule or the like. Also, the case with a lens 850 has a lens 854 that is formed not only with a downward convex shape but also with an upward convex shape, which is different from the optical module 100 in accordance with the embodiment described above.

Also, the optical module 800 in accordance with the seventh modified example is different from the optical module 100 in accordance with the embodiment described above in that its optical element includes optical components at two places. Concretely, an optical element 730 of the seventh modified example includes a light emitting element 34 and a photodetecting element 734. The photodetecting element 734 can detect light coming from outside. For example, when the light emitting element 34 emits light, and an object to be measured reflects the light, the reflected light can be detected by the photodetecting element 734. In this manner, as the optical module 800 is equipped with the light emitting element 34 and the photodetecting element 734, the optical module 800 can function as an independent sensor without connecting to an optical fiber or the like.

Other details of the structure of the optical module 800 and its manufacturing process are generally the same as those of the structure of the optical module 100 and its manufacturing process described above, and therefore their description is omitted.

Embodiments of the invention are described above. It is noted however that the invention is not limited to the embodiments described above. For example, the invention may include compositions that are substantially the same as the compositions described in the embodiments (for example, a composition with the same function, method and result, or a composition with the same objects and results). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. An optical module comprising:
   an optical element;
   a support member for supporting the optical element;
   a lid member that seals the optical element with respect to the support member;
   a sealing member that is provided to bond the lid member with the support member; and
   a case with a lens provided such that the lens is disposed on an optical path of light oscillated by the optical element, wherein the case with the lens is in an optical axis direction of light passing through the lens opposed to and in contact with the support member.

2. An optical module according to claim 1, wherein the support member is formed from an enclosure having a base section and a frame section provided on the base section, the optical element is provided inside the frame section, the lid member is composed of a transparent substrate provided above the frame section, the sealing member is provided in a portion of an upper surface of the frame section, and the case with the lens can be in contact with another portion of the upper surface of the frame section.

3. An optical module according to claim 2, wherein the frame section has a rectangular outer circumference, and the case with the lens is in contact with end sections along a pair of parallel sides in an outer circumferential section of the frame section.

4. An optical module according to claim 2, wherein the frame section has a rectangular outer circumference, and the case with the lens is in contact with corner sections of the frame section.

5. An optical module according to claim 2, further comprising adhesive provided between an outer side surface of the frame section and the case with the lens.

6. An optical module according to claim 2, wherein the transparent substrate is composed of a glass substrate, and the sealing member is composed of low melting-point glass.

7. An optical module according to claim 1, wherein the support member is formed from an enclosure having a base section and a frame section provided on the base section, the optical element is provided inside the frame section, the lid section is composed of a transparent substrate provided above the frame section, the sealing member is provided on an upper surface of the frame section, and the case with the lens is in contact with an upper surface of the base section outside the frame section.

8. An optical module according to claim 1, further comprising a spacer inside the frame section and above the base section, wherein the optical element is provided above the spacer.

9. An optical module according to claim 1, wherein the case with the lens is a connector with a lens having a sleeve and a lens.

10. A method for manufacturing an optical module equipped with an optical element, the method comprising the steps of:
  (a) preparing a support member for supporting an optical element;
  (b) affixing the optical element to the support member;
  (c) providing a sealing member on an upper surface of the support member and around the optical element;
  (d) disposing a lid member for sealing the optical element above the sealing member and affixing the lid member to the support member; and
  (e) affixing a case with a lens to the support member,
  wherein, in the step (e), the case with the lens is affixed to the support member such that the lens is disposed on an optical path of light oscillated by the optical element, and the case with the lens is disposed in an optical axis direction of light passing through the lens opposite to and in contact with the support member.

11. A method for manufacturing an optical module according to claim 10, further comprising, after the step (a), the steps of (f) providing a spacer on the support member; and (g) pressing the spacer to cause plastic deformation therein.

* * * * *